(12) United States Patent
Pai et al.

(10) Patent No.: US 6,429,034 B1
(45) Date of Patent: Aug. 6, 2002

(54) METHOD OF MAKING HIGH ASPECT RATIO FEATURES DURING SURFACE MICROMACHINING

(75) Inventors: Minfan Pai; Norman C. Tien, both of Ithaca; J. Greg Couillard, Newfield, all of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/464,971

(22) Filed: Dec. 16, 1999

(51) Int. Cl.$^7$ ................................................ H01L 21/00
(52) U.S. Cl. .............................. 438/50; 438/22; 438/52
(58) Field of Search ............................... 438/50, 52–53, 438/22–24

(56) References Cited

U.S. PATENT DOCUMENTS

| | | | |
|---|---|---|---|
| 5,181,156 A | 1/1993 | Gutteridge et al. | 361/283 |
| 5,393,710 A | 2/1995 | Park et al. | 437/228 |
| 5,426,070 A | 6/1995 | Shaw et al. | 437/203 |
| 5,628,917 A | 5/1997 | MacDonald et al. | 216/2 |
| 5,719,073 A | 2/1998 | Shaw et al. | 437/228 |
| 5,725,729 A | 3/1998 | Greiff | 156/657.1 |
| 5,726,073 A | 3/1998 | Zhang et al. | 437/228 |
| 5,846,849 A | 12/1998 | Shaw et al. | 438/52 |
| 5,994,816 A | 11/1999 | Dhuler et al. | 310/307 |
| 6,013,573 A * | 1/2000 | Yagi | 438/619 |

OTHER PUBLICATIONS

E.W. Becker, W. Ehrfeld, P. Hagmann, A. Maner and D. Muchmeyer–Fabrication of microstructures with high aspect ratios and great structural heights by synchrotron radiation lithography, gavanoforming, and plastic moulding (LIGA process)—Mar. 3, 1986.

Jurgen Mohr, Jost Gottert, Andre Muller, Patrick Ruther, Klaus Wengeling, Forschungszentrum Kalsruhe and Institute fUr Mikrostructurtechnik–Micro–Optical and Opto–Mechanical Systems Fabricated by the LIGA Technique.

Soek–Whan Chung and Yong–Kweon Kim–Measurements of a Fabricated Micro Mirror Using a Lateral–Effect Position–Sensitive Photodiode–Dec. 1998.

Meng–Hsiung Kiang, Olav Solgaard, Kam Y. Lau, and Richard S. Muller–Electrostatic Combdrive–Actuated Micromirros for Laser–Beam Scanning and Positioning–Mar., 1998.

Cornel Marxer, Christian Thio, Marc–Alexia Gretillat, Nicolaas F. de Rooij, Rainer Battig, Oliver Anthamatten, Bernd Valk and Paul Vogel–Vertical Mirros Fabricated by Deep Reactive Ion Etching for Fiber–Optic Switching Applications–Sep., 1997.

Yuji Uenishi, Masahiro Tsugai and Mehran Mehregany— Micro–opto–mechanical devices fabricated by anisotropic etching of (110) silicon.

* cited by examiner

Primary Examiner—Jey Tsai
(74) Attorney, Agent, or Firm—Joanne N. Pappas

(57) ABSTRACT

A method is provided for making a microelectromechanical device with high aspect ratio features. First, an insulating layer is deposited on a substrate. Next, a base in the form of a first conducting layer is deposited on the insulating layer and is patterned. A first sacrificial layer is then deposited on the first conducting layer and patterned. A slider in the form of a second conducting layer is then deposited on the first sacrificial layer and patterned. A second sacrificial layer is then deposited on the second conducting layer and patterned. Next, a retainer in the form of a third conducting layer is deposited on the second sacrificial layer and patterned. A mask is then deposited on the third conducting layer and patterned. Next, a reflector in the form of a fourth layer is deposited through the mask onto the third conducting layer. Finally, the mask, first sacrificial layer and second sacrificial layer are removed.

19 Claims, 1 Drawing Sheet

METHOD OF MAKING HIGH ASPECT RATIO FEATURES DURING SURFACE MICROMACHINING

BACKGROUND OF THE INVENTION

1. Field of the Invention

The present invention relates generally to microelectromechanical systems, and particularly to a method of fabricating a microelectromechanical system.

2. Technical Background

Micromechanical actuators are essential for microelectromechanical systems (MEMS) that require moveable components. One process commonly used to fabricate MEMS is surface micromachining. Surface micromachining involves the deposition and patterning of semiconductor thin films. An example of such a process entails the deposition of three structural thin film layers of polycrystalline silicon and two sacrificial layers of silicon dioxide. While this process allows a great deal of flexibility in device design, it has certain drawbacks.

One major drawback of this technique is its inability to yield tall structures such as high quality mirrors. Mirrors fabricated by this process are currently produced as horizontal, planar thin films. They are then rotated 90° by hand to form vertical structures at right angles to the substrate. This task is time-consuming, difficult, and reduces yield due to breakage. Further, the assembled mirrors are often warped due to geometry and film stresses. The mirrors may also require release holes in the surface after initial formation to permit etching of certain sacrificial layers located thereunder.

On the other hand, a known method of making tall structures is referred to in the art as LIGA. This method involves lithography, electrodeposition (i.e., galvanoforming), and molding. According to this method, optical or x-ray lithography is used to define patterns in polymer resist films such as polymethyl methacrylate (PMMA). The patterns are then filled with metal by electrodeposition.

While this method permits the formation of relatively large structures with high aspect ratios (tens or hundreds of microns tall and only a few microns thick), it also has certain drawbacks. One drawback is that this method does not allow the device complexity or freedom of motion obtained by surface micromachining.

In view of the foregoing, it would be desirable to provide a method of fabricating MEMS devices with the complex features of surface micromachining and the high aspect ratios of LIGA.

SUMMARY OF THE INVENTION

The above and other objects are provided by the following method. First, an insulating layer is deposited on a substrate. Next, a base in the form of a first conducting layer is deposited on the insulating layer and is patterned. A first sacrificial layer is then deposited on the first conducting layer and patterned. A slider in the form of a second conducting layer is then deposited on the first sacrificial layer and patterned. A second sacrificial layer is then deposited on the second conducting layer and patterned. Next, a retainer in the form of a third conducting layer is deposited on the second sacrificial layer and patterned. A mask is then deposited on the third conducting layer and patterned. Next, a reflector in the form of a fourth layer is deposited through the mask onto the third conducting layer. Finally, the mask, first sacrificial layer and second sacrificial layer are removed.

BRIEF DESCRIPTION OF THE PREFERRED EMBODIMENTS

Figure 1:
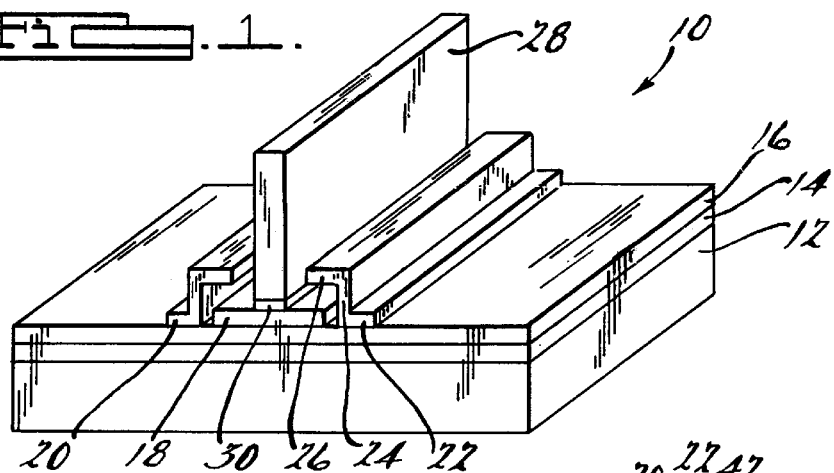
FIG. 1 is a perspective view of a MEMS device incorporating the teachings of the present invention.

The present invention is directed towards a method of producing a microelectromechanical device. The method is advantageous in that it allows complex devices to be made with high aspect ratio components. Referring now to the drawing figures, FIG. 1 illustrates a microelectromechanical device 10 incorporating the teachings of the present invention.

The device 10 includes a planar substrate 12. The substrate 12 may consist of any inert material which is durable enough to withstand subsequent processing such as quartz or glass but is preferably formed of <100> crystal silicon since this material is durable and is able to withstand elevated temperatures and exposure to chemical baths.

A thin film insulating layer 14 is disposed on the substrate 12. The insulating layer 14 provides electrical isolation for the remaining components of the device 10 relative to the substrate 12. The insulating layer 14 is planar and conformal to the substrate 12. While the thickness of the insulating layer 14 may be tailored to meet specific design goals, it is presently preferred to be about 0.6 micrometers thick since this depth provides sufficient insulating performance. Also, the insulating layer 14 may consists of any insulating material such as silicon dioxide or diamond film but is preferably formed of silicon nitride ($Si_3N_4$) since this material is insulative and durable, and is not susceptible to the same chemicals as the remaining layers of the device 10.

A thin film base in the form of a first conductive layer 16 is disposed on the insulating layer 14. The first conductive layer 16 is planar and conformal to the insulating layer 14. The first conductive layer 16 may be deposited to many different depths according to design goals, but is preferably about 0.5 micrometers thick since this thickness provides good conductivity. Also, the first conductive layer 16 may consist of any conductive material such as aluminum or another metal, but is preferably formed of silicon since this material is durable and can be doped to make it conductive.

A slider in the form of a thin film second conductive layer 18 is disposed adjacent the first conductive layer 16. Preferably, the second conductive layer 18 is disposed along a central portion of the top surface of the first conductive layer 16 and is movable relative thereto. The second conductive layer 18 is planar and, while other depths are possible, is preferably about 2.0 micrometers thick. As with the first conductive layer 16, the second conductive layer 18 may consist of any conductive material, but is preferably formed of silicon.

A retainer in the form of a pair of inverted L-shaped members of a third conductive layer 20 are disposed on the first conductive layer 16 and overlap the second conductive layer 18. Each member of the third conductive layer 20 includes a first lateral section 22 extending along the plane of the first conductive layer 16 and coupled thereto. A vertical section 24 extends generally orthogonally from the first lateral section 22 such that it projects away from the first conductive layer 16 at a location spaced apart from the side edge of the second conductive layer 18. A second lateral section 26 extends generally orthogonally from the vertical section 24 opposite the first lateral section 22. The second lateral section 26 is spaced apart from the first conductive layer 16 and second conductive layer 18.

The vertical section 24 of each member of the third conductive layer 20 provides a lateral stop to contain the second conductive layer 18 along a pre-selected path relative to the first conductive layer 16. The second lateral section 26 of each member of the third conductive layer 20 provides a vertical stop for the second conductive layer 18. Although the third conductive layer 20 may consist of other conductive materials and may be formed to a different thickness, it is preferably formed of silicon and is preferably about 1.5 micrometers thick.

A reflector in the form of a vertically elongated fourth layer 28 having a high aspect ratio is coupled to the second conductive layer 18 between the opposed ends of the members of the third conductive layer 20. In the illustrated embodiment, the fourth layer 28 is coupled to the second conductive layer 18 by way of a plating layer 30 interposed therebetween.

The plating layer 30 may consist of any material which is different from the first, second and third conductive layers 16, 18, and 20, and which is easily removed without damaging the other layers of the device 10, such as copper, gold, or titanium. Presently, the plating layer 30 preferably comprises titanium-copper-titanium since this material is easily removed without damaging the other layers of the device 10. In some cases, the plating layer 30 may not be necessary to interconnect the fourth layer 28 and the second conductive layer 18.

The fourth layer 28 has a high aspect ratio and is preferably about 30 to 200 micrometers tall to provide a relatively large reflective surface. The fourth layer 28 may consist of any reflective material such as nickel, gold, or gold plated nickel which provides good reflectivity and is depositable via electrodeposition from a liquid solution, but is preferably formed of gold which is highly reflective at preferred communication wavelengths. The fourth layer 28 provides a high-quality micromirror having a relatively large planar surface which is advantageously added to the surface of the microelectromechanical device 10. As such, the device 10 has the advantages of surface microelectromechanical devices including design flexibility, freedom of motion, and speed, with the advantage of high optical performance.

Figure 2:
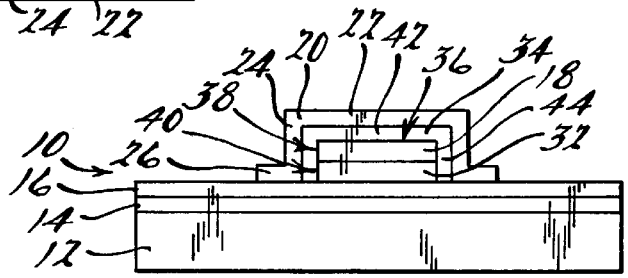
FIG. 2 is a cross-sectional view of the MEMS device of FIG. 1 after the first set of manufacturing steps.

Referring now to FIG. 2, the method for fabricating the device 10 will be described. The method starts by providing the substrate 12 and then depositing the insulating layer 14 thereon. The deposition of the insulating layer 14, as well as the other layers described below, is preferably performed by low pressure chemical vapor deposition but may also be performed by other deposition techniques if desired including but not limited to plasma enhanced chemical vapor deposition. After deposition, the insulating layer 14 is patterned by reactive ion etching as needed. If desired, a wet chemical etch or ion milling could be used instead of reactive ion etching for the insulating layer 14 and each of the layers described below.

The base or first conductive layer 16 is then deposited on the insulating layer 14. Preferably, the first conductive layer 16, as well as the remaining conductive layers, is deposited by low pressure chemical vapor deposition but may also be deposited by sputtering if desired. The first conductive layer 16 is then patterned by reactive ion etching.

A first sacrificial layer 32 is then deposited on the first conductive layer 16 by low pressure chemical vapor deposition although plasma enhanced chemical vapor deposition may substitute therefore. The first sacrificial layer 32 is then patterned by reactive ion etching such that it generally resides along a central portion of the first conductive layer 16. Preferably, the first sacrificial layer 32 is conformal to the first conductive layer 16. While the first sacrificial layer 32 may consist of any easily removed material such as polymers or metals, it is preferably formed of silicon dioxide ($SiO_2$) since silicon dioxide is easily deposited and permits selective removal. Also, the thickness of the first sacrificial layer 32 may be tailored according to specific design goals but is preferably about 2.0 micrometers thick which provides good spacing between the first conductive layer 16 and second conductive layer 18.

Next, the slider or second conductive layer 18 is deposited on the first sacrificial layer 32. As with the first conductive layer 16, the second conductive layer 18 is preferably deposited by low pressure chemical vapor deposition but other conventional techniques may substitute therefore. The second conductive layer 18 is then patterned to its desired shape by reactive ion etching. Preferably, the second conductive layer 18 is shaped to reside over a central portion of the first conductive layer 16.

A second sacrificial layer 34 is then deposited over the top surface 36 of the second conductive layer 18 and along the side portions 38 of the second conductive layer 18 and the side portions 40 of the first sacrificial layer 32. As such, the second sacrificial layer 34 includes a lateral section 42 adjacent the top surface 36 and a pair of vertical sections 44 adjacent the side portions 38 and 40. The vertical sections 44 are coupled to the first conductive layer 16 at their terminal ends.

As with the first sacrificial layer 32, the second sacrificial layer 34 is preferably deposited by low pressure chemical vapor deposition. Further, the second sacrificial layer 34 is preferably formed of silicon dioxide ($SiO_2$). The thickness of the second sacrificial layer 34 may be tailored according to specific design goals but is preferably about 0.75 micrometers thick which provides good spacing between the second conductive layer 18 and the third conductive layer 20.

Next, the retainer or third conductive layer 20 is deposited over the second sacrificial layer 34, preferably by low pressure chemical vapor deposition. The first lateral section 22 of the third conductive layer 20 is adjacent the lateral section 42 of the second sacrificial layer 34 while the vertical sections 24 of the third conductive layer 20 are adjacent the vertical sections 44 of the second sacrificial layer 34. The second lateral sections 26 of the third conductive layer 20 extend along the first conductive layer 16 and are coupled thereto.

Figure 3:
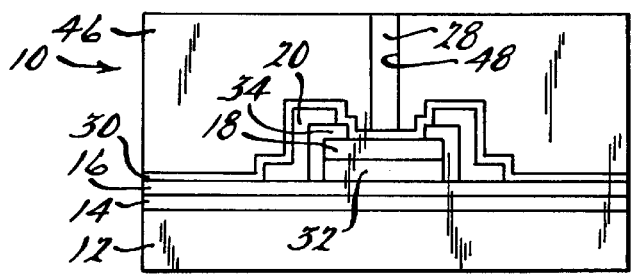
FIG. 3 is a cross-sectional view of the MEMS device of FIG. 2 after the next set of manufacturing steps.

Turning now to FIG. 3, the next several steps of the method of forming the device 10 of the present invention will be described. First, the third conductive layer 20 is patterned by reactive ion etching to expose a portion of the second sacrificial layer 34. Next, the second sacrificial layer 34 is patterned by reactive ion etching to expose a portion of the second conductive layer 18. Thereafter, the plating layer 30 is deposited on the second conductive layer 18. In this process, the plating layer 30 also covers the exposed portions of the first conductive layer 16, the third conductive layer 20, and the second sacrificial layer 34. The plating layer 30 is preferably deposited by sputtering although other techniques such a s electron beam sublimation or thermal evaporation may substitute therefor.

Next, a mask 46 is deposited on the plating layer 30. The mask 46 is preferably a thick polymer such as polymethyl methacrylate (PMMA) since this material is made soluble by exposure to ultraviolet radiation. The mask 46 is next patterned by photoimaging with X-rays to form a vertically extending window 48 therein aligned with the second conductive layer 18. The reflector or fourth layer 28 is then deposited through the window 48 such that it couples to the second conductive layer 18 by way of the plating layer 30. This is preferably accomplished by electroplating techniques.

Figure 4:
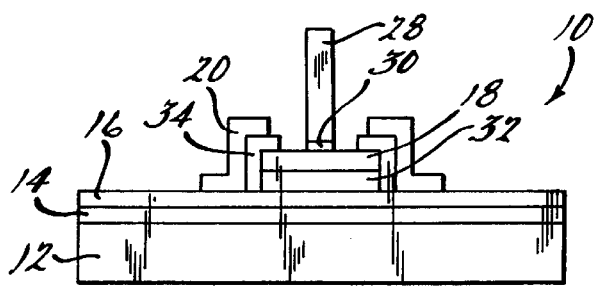
FIG. 4 is a cross-sectional view of the MEMS device of FIG. 3 after the next set of manufacturing steps.

Referring now to FIGS. 3 and 4 collectively, the next sequence of steps for performing the method of the present invention will be described. First, the mask 46 is stripped away from the assembly. Preferably this is accomplished by solvents such as acetone or by an oxygen plasma. Next, the plating layer 30 is removed from all exposed surfaces. Preferably this is accomplished by ion milling or selective chemical etching. Following these steps, the device 10 is as illustrated in FIG. 4.

Figure 5:
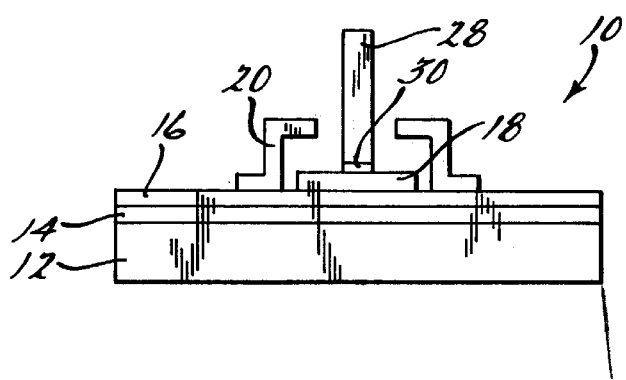
FIG. 5 is a cross-sectional view of the MEMS device of FIG. 4 after the final set of manufacturing steps.

Referring now to FIGS. 4 and 5 collectively, the final step is to remove the first and second sacrificial layers 32 and 34. Preferably this is accomplished by selective dissolution with hydrofluoric acid or the like. This allows selected parts of the device 10 to move relative to one another. This is advantageous for devices such as vibromotors. Following the foregoing steps, the device 10 is fully formed. As such, a microelectromechanical device is provided having the complexity of surface micromachining and the high aspect ratios of LIGA.

Those skilled in the art can now appreciate from the foregoing description that the broad teachings of the present invention can be implemented in a variety of forms. For example, while the first, second, and third conductive layers 16, 18 and 20 are preferably conductive, certain applications will only require these layers to be structural. As such, these layers need not be conductive. Therefore, while this invention has been described in connection with particular examples thereof, the true scope of the invention should not be so limited since other modifications will become apparent to the skilled practitioner upon a study of the drawings, specification and following claims.

What is claimed is:

1. A method of producing a microelectromechanical device comprising the steps of:

providing a base;

depositing a first conductive layer on said base;

depositing a first sacrificial layer on said first conductive layer;

depositing a slider on said first sacrificial layer;

depositing a second sacrificial layer on said slider;

depositing a retainer on said second sacrificial layer, such that said retainer overlaps a top surface and extends along a side surface of said second sacrificial layer and couples to said first conductive layer;

coupling a member having a high aspect ratio to said slider; and removing said first and second sacrificial layers such that said slider is moveable relative to said base within an area bound by said retainer.

2. The method of claim 1 further comprising:

patterning said retainer to expose a portion of said second sacrificial layer prior to said step of coupling said member to said slider.

3. The method of claim 2 further comprising:

patterning said second sacrificial layer to expose a portion of said slider prior to said step of coupling said member to said slider.

4. The method of claim 3 further comprising:

depositing a plating layer on said slider after said step of patterning said second sacrificial layer.

5. The method of claim 1 further comprising:

depositing a mask on said retainer prior to said step of coupling said member to said slider.

6. The method of claim 5 further comprising:

patterning said mask to expose a portion of said slider prior to said step of coupling said member to said slider.

7. The method of claim 6 further comprising:

depositing said member through said pattern in said mask onto said slider.

8. The method of claim 7 further comprising:

removing said mask after said step of depositing said member.

9. The method of claim 1 further comprising:

patterning said second sacrificial layer such that said second sacrificial layer overlaps said slider.

10. The method of claim 1 further comprising:

patterning said retainer such that said retainer overlaps said slider.

11. A method of producing a microelectromechanical device comprising the steps of:

providing a substrate;

depositing a generally planar insulating layer on said substrate;

depositing a generally planar first conductive layer on said insulating layer;

depositing a first sacrificial layer along a central portion of said first conductive layer;

depositing a second conductive layer on said first sacrificial layer such that said second conductive layer is spaced apart from said first conductive layer by said first sacrificial layer;

depositing a second sacrificial layer on said second conductive layer such that said second sacrificial layer covers a top surface of said second conductive layer and extends along a side portion of said second conductive layer and a side portion of said first sacrificial layer and couples with said first conductive layer;

depositing a retainer layer on said second sacrificial layer such that said retainer layer overlaps said second sacrificial layer and couples with said first conductive layer;

patterning said retainer layer to expose a portion of said second sacrificial layer opposite said second conductive layer;

patterning said second sacrificial layer to expose a portion of said second conductive layer;

coupling a reflector having a high aspect ratio to said portion of said second conductive layer; and removing said first and second sacrificial layers such that said second conductive layer is slideably disposed adjacent said first conductive layer and is confined relative thereto by said retainer layer.

12. The method of claim 11 further comprising:
depositing a mask on said retainer layer after said step of patterning said second sacrificial layer.

13. The method of claim 12 further comprising:
patterning said mask to expose a portion of said second conductive layer.

14. The method of claim 13 further comprising:
depositing said reflector through said pattern in said mask such that said reflector couples to said second conductive layer.

15. The method of claim 14 further comprising:
removing said mask after said step of depositing said reflector.

16. The method of claim 11 further comprising:
depositing a plating layer on said second conductive layer after said step of patterning said second sacrificial layer.

17. A method of producing a microelectromechanical device comprising the steps of:

providing a single-crystal silicon wafer;

depositing a generally planar silicon nitride layer on said wafer;

depositing a generally planar first silicon layer on said silicon nitride layer;

depositing a first silicon dioxide layer along a central portion of said first silicon layer;

depositing a second silicon layer on said first silicon dioxide layer such that said second silicon layer is spaced apart from said first silicon layer by said first silicon dioxide layer;

depositing a second silicon dioxide layer on said second silicon layer such that said second silicon dioxide layer covers a top surface of said second silicon layer and extends along a side portion of said second silicon layer and a side portion of said first silicon dioxide layer and couples with said first silicon layer;

depositing a third silicon layer on said second silicon dioxide layer such that said third silicon layer overlaps said second silicon dioxide layer and couples with said first silicon layer;

patterning said third silicon layer to expose a portion of said second silicon dioxide layer opposite said second silicon layer;

patterning said second silicon dioxide layer to expose a portion of said second silicon layer;

depositing a polymer mask on said third silicon layer;

patterning said polymer mask to expose a portion of said second silicon layer;

depositing a gold layer with a high aspect ratio through said pattern in said polymer mask such that said gold layer couples to said portion of said second silicon layer;

removing said mask; and removing said first and second silicon dioxide layers such that said second silicon layer is slideably disposed adjacent said first silicon layer and is confined relative thereto by said third silicon layer.

18. The method of claim 17 further comprising:
depositing a titanium-copper-titanium plating layer on said second silicon layer after said step of patterning said second silicon dioxide layer.

19. The method of claim 18 further comprising:
removing said plating layer from said second silicon layer except for a section between said second silicon layer and said gold layer.

* * * * *